United States Patent [19]

Saito

[11] Patent Number: 5,550,517
[45] Date of Patent: Aug. 27, 1996

[54] OSCILLATION CIRCUIT HAVING HYSTERESIS INVERTER COUPLED TO A DELAY CIRCUIT

[75] Inventor: Teruhiko Saito, Kasugai, Japan

[73] Assignees: Fujitsu Limited, Kawasaki; Fujitsu VLSI Limited, Kasugai, both of Japan

[21] Appl. No.: 358,470

[22] Filed: Dec. 19, 1994

[30] Foreign Application Priority Data

Dec. 20, 1993 [JP] Japan .................. 5-320300

[51] Int. Cl.$^6$ .................................. H03K 3/03
[52] U.S. Cl. ................. 331/111; 331/143; 331/179; 331/DIG. 3
[58] Field of Search .................. 331/111, 143, 331/153, 173, DIG 3, 179, 108 C, 175, 57

[56] References Cited

U.S. PATENT DOCUMENTS 4,414,515  11/1983  Suzuki et al. .................. 331/111
5,424,690  6/1995  Ohno .................................. 331/57
5,442,325  8/1995  Bosshart .............................. 331/57

*Primary Examiner*—Robert Pascal
*Assistant Examiner*—David H. Vu
*Attorney, Agent, or Firm*—Nikaido, Marmelstein, Murray & Oram LLP

[57] ABSTRACT

An oscillation circuit is disclosed, which comprises an input stage, intermediate stage and output stage circuits which are coupled to one another. The input stage circuit is composed of a hysteresis inverter having a first threshold value and a second threshold value that is set between the first threshold value and the potential of a first power supply. The intermediate stage circuit includes an inversion circuit and a delay circuit that is provided between the hysteresis inverter and the inversion circuit. The output stage circuit includes an output terminal connected to the hysteresis inverter, a capacitor provided between the output terminal and the first power supply and an inverter circuit connected to the inversion circuit. The inverter circuit controls the charging and discharging of the capacitor to generate an oscillation output signal at the output terminal.

12 Claims, 11 Drawing Sheets

OSCILLATION CIRCUIT HAVING HYSTERESIS INVERTER COUPLED TO A DELAY CIRCUIT

BACKGROUND OF THE INVENTION

1. Field of the Invention

The present invention relates to an oscillation circuit and in particular to an oscillation circuit incorporated in an integrated circuit that generates signals at a specific frequency, such as, for example, a clock signal.

2. Description of the Related Art

With the rapid increase in miniaturized portable electronic devices, a need exists for semiconductors for these devices that operate with lower power consumption rates, and specifically, at lower voltage supply levels. Similarly, the oscillation circuitry incorporated into such semiconductor integrated circuits should operate with stable frequency characteristics with the lower supply voltages and the lower power consumption rates designed for today's semiconductors.

FIG. 1 shows a first example of conventional oscillation circuits. A first inverter 1a receives an oscillation output signal Vout from an output terminal $T_0$. The inverter 1a is a hysteresis inverter circuit which has the hysteresis characteristic that different inversion threshold values exist depending on whether the voltage level of the input signal rises or whether the voltage level falls. Hereinafter, the threshold value for the former case is called a rising or high threshold value $V_{IH}$ and the threshold value for the latter case is called a falling or low threshold value $V_{IL}$.

The output signal, SG1, of the first inverter 1a is input to a second inverter 1b. This oscillation circuit includes a NOR gate 2a which has first and second input terminals. The first input terminal of the NOR gate 2a receives the output signal, SG2, of the second inverter 1b. The output signal, SG3, of the NOR gate 2a is supplied as an input signal SG4 via a capacitor C1 to the input terminal of a third inverter circuit 1c. A supply voltage $V_{CC}$ is supplied via a resistor R1 to the input terminal of the inverter 1c. The resistor R1 and the capacitor C1 form a differentiator, i.e., a circuit whose output voltage is proportional to the rate of change of the input voltage.

The output signal, SG5, of the third inverter 1c is input to the second input terminal of the NOR gate 2a and to the input terminal of a fourth inverter 1d. The output signal, SG6, of the inverter 1d is input to the first input terminal of a NAND gate 3a. A signal ST instructing the start of oscillation is input to the second input terminal of the NAND gate 3a. The output signal, SG7, of the NAND gate 3a is input to the gates of a P channel MOS transistor Tr1 and an N channel MOS transistor Tr2. The transistor Tr1 has a source connected to a power supply $V_{CC}$ and a drain connected via a resistor R2 to the output terminal $T_0$. The transistor Tr2 has a drain connected to the output terminal $T_0$ and a source connected to the ground GND. The output terminal $T_0$ is connected via a capacitor C2 to the ground GND.

The operation of the oscillation circuit will now be described with reference to FIG. 2. With this oscillation circuit supplied with the power from the power supply $V_{CC}$ and with a low level oscillation start signal ST, the output signal SG7 of the NAND gate 3a goes high. This turns on the transistor Tr2, causing the oscillation output signal Vout to go low. At this time, the input signal SG4 of the third inverter 1c is high and the output signal SG5 of the inverter circuit 1c is low. Since the output signal SG2 of the second inverter 1b is low, the output signal SG3 of the NOR gate 2a is high, as are both terminals ends of the capacitor C1. Under this situation, when the oscillation start signal ST goes high, the output signal SG7 of the NAND gate 3a goes low, turning off the transistor Tr2 and turning on the transistor Tr1. Consequently, the capacitor C2 is charged via the resistor R2, causing the potential of the oscillation output signal Vout to rise from the ground level in accordance with the time constant which is determined by the resistor R2 and the capacitor C2, as shown in FIG. 2.

When the potential of the oscillation output signal Vout reaches the high threshold value $V_{IH}$ for the first inverter 1a, the output signal SG1 of the inverter 1a goes low causing the output signal SG2 of the second inverter 1b to go. As a result, the output signal SG3 of the NOR gate 2a goes low, as does the input signal SG4 of the third inverter 1c. When the level of the input signal SG4 of the inverter 1c is lower than the threshold value $V_{IH}$ for the inverter 1c, the output signal SG5 of the inverter 1c is maintained. Consequently, the output signal SG6 of the fourth inverter 1d goes low and the output signal SG7 of the NAND gate 3a goes high. This turns off the transistor Tr1 and turns on the transistor Tr2, so that the charges accumulated in the capacitor C2 are discharged to the ground GND via the transistor Tr2. This decreases the potential of the oscillation output signal Vout. When the output signal SG3 of the NOR gate 2a goes low, the charge current is supplied via the resistor R1 to the capacitor C1 from the power supply $V_{CC}$, causing the potential of the input signal SG4 of the third inverter 1c to rise in accordance with the time constant determined by the capacitor C1 and the resistor R1.

When the potential of the input signal SG4 rises above the threshold value $V_{IH}$ for the third inverter 1c, the output signal SG5 of the inverter circuit 1c is inverted to a low level. As a result, the output signal SG6 of the fourth inverter 1d goes high and the output signal SG7 of the NAND gate 3a goes low. This turns off the transistor Tr2 and turns on the transistor Tr1, so that the potential of the oscillation output signal Vout, which has dropped nearly to the ground level, starts rising again. When the potential of the oscillation output signal Vout falls down to the low threshold value $V_{IL}$, the output signal SG1 of the inverter 1a goes high, causing the output signal SG2 of the second inverter 1b to go low. The output signal SG3 of the NOR gate 2a is, however, kept high as long as the output signal SG5 of the third inverter 1c is high.

The duration when the transistor Tr2 is turned on is determined by the differential circuit formed by the resistor R1 and the capacitor C1. The time constant of the differential circuit is set in such a manner that the transistor Tr2 is kept on even if the potential of the oscillation output signal Vout falls below the low threshold value $V_{IL}$ for the first inverter 1a, and that the potential of the oscillation output signal Vout starts rising when the oscillation output signal Vout falls nearly to the ground level. In the above-described manner, the conventional oscillation circuit produces oscillation signals at the oscillation frequency in accordance with the time constants defined by the values of the resistor combinations R1,C1 and R2,C2.

In order to permit the conventional oscillation circuit to start its oscillation, the supply voltage $V_{CC}$ should be supplied to the oscillation circuit. In addition, a high level oscillation start signal ST, should be supplied to the NAND gate 3a. This requires a separate circuit to supply the oscillation circuit with the oscillation start signal ST.

When the supply voltage $V_{CC}$ falls due to some reason, the load driving performance of the NOR gate 2a is reduced.

Even when the NOR gate 2a outputs a low level output signal SG3, the input signal SG4 of the third inverter 1c will not drop to ground. This decreases the duration of time from when the NOR gate 2a outputs the low level output signal SG3 to the time when the input signal SG4 of the third inverter 1c exceeds the threshold value for the inverter 1c (i.e., the pulse width of the H-level output signal SG5 from the inverter 1c). This, in turn, shortens the duration of time during which the transistor Tr2 is turned on, preventing the charge accumulated in the capacitor C2 from being adequately discharged. When the oscillation output signal Vout fails to drop to ground, the voltage swing of the oscillation output signal Vout is reduced. If decreases in the supply voltage $V_{CC}$ further shortens the ON duration during which the transistor Tr2 is turned on, the potential of the oscillation output signal Vout cannot fall below the low threshold value $V_{IL}$ for the first inverter 1a. In this case, no oscillation occurs even when the oscillation start signal ST is supplied to the oscillation circuit.

FIG. 3 shows the relationship between the supply voltage $V_{CC}$ and the rate of a change in the frequency of the oscillation output signal Vout in the oscillation circuit shown in FIG. 1. Here, for example, the resistance R2 is set to 135 kO and the capacitance C2 is set to 815 pF. The choice of these values cause the frequency of the oscillation output signal Vout to be 8 kHz when the supply voltage $V_{CC}$ is 1.5 V. The rate of the frequency change R (%) is computed from the following equation.

$$R = 100 \times (f_{1.5\ V} - f_{VCC})/f_{1.5\ V}$$

where $f_{1.5\ V}$ is the frequency of the output signal Vout when the supply voltage $V_{CC}$=1.5 V, and $f_{VCC}$ is the frequency of the output signal Vout with respect to the supply voltage $V_{CC}$.

In this oscillation circuit, when the supply voltage $V_{CC}$ is lower than 1.4 V, signal oscillation will not occur. The resistance of the resistor R1 and the capacitance of capacitor C1 need to be set large enough to ensure that the potential of output signal Vout, at a high threshold $V_{IH}$, has adequate time to decrease in potential to ground or zero potential. In other words, the time constant controlled by resistor R1 and capacitor C1 needs to be carefully set. These values, moreover, need to be set large enough to ensure the complete discharge of capacitor C2, even with a reduced load driving performance of the NOR gate 2a.

However, increasing the capacitance of the capacitor C1 and the resistance of the resistor R1 formed on a semiconductor substrate increases the areas they occupy on the substrate. This reduces the integration level of semiconductor circuits. If the voltage swing of the oscillation output signal Vout is reduced, the oscillation frequency output signal Vout will be significantly affected by variations in the high threshold value $V_{IH}$ and low threshold value $V_{IL}$ of the first inverter 1a. This often occurs due to variations in quality in the manufacturing process. In addition, the reduction in the voltage swing of the oscillation output signal Vout causes the frequency of the output signal Vout to be influenced by the operational delay time of the inverter 1a.

Undesirable variations in oscillation frequency of signal Vout, due to the delay time of inverter 1a, may be diminished by increasing the ratio of each transistors' gate width to their gate length to shorten the delay time of inverter 1a. Increasing the gate width/length ratio of the transistors in inverter 1a, however, results in an increase in the flowthrough currents in the inverter 1a and thus in an increase in the oscillating circuits power consumption. In addition, the rising speed of the oscillating signal Vout input to the inverter 1a is undesirably slow, as shown in FIG. 2.

FIG. 4 shows a second conventional oscillation circuit. This oscillation circuit has odd-numbered stages of inverters 1e, 1f and 1g connected in series (three stages inverters in this case). The output terminal of the third inverter 1g is connected to the input terminal of the first inverter 1e so that the inverter 1e to 1g and a resistor R3 form a closed loop circuit. The input terminal of the first inverter 1e, which is a hysteresis inverter, is connected to the ground GND via a capacitor C3. In this oscillation circuit, the output signal of the third inverter 1g is delayed in accordance with the time constant of an integration circuit formed by the resistor R3 and the capacitor C3. The delayed signal is input to the hysteresis inverter 1e and the charged potential of the capacitor C3 is determined by the inverter 1e. Accordingly, the output signal Vout oscillates at the oscillation frequency according to the time constant, and the voltage swing of the output signal Vout is established as the voltage difference between the high threshold value $V_{IH}$ and low threshold value $V_{IL}$ of the inverter 1e.

According to the second oscillation circuit, the voltage swing of the output signal Vout is smaller than the voltage swing in the first conventional oscillation circuit. In order to accurately set the frequency of the oscillation signal Vout, the high threshold value $V_{IH}$ and low threshold value $V_{IL}$ for the first inverter 1e should be set accurately. The threshold values $V_{IH}$ and $V_{IL}$ vary due to variations in quality during the manufacturing process of oscillation circuits. It is therefore difficult to accurately set the frequency of the oscillation signal Vout for this second type of oscillation circuit.

FIG. 5 shows the relationship between the supply voltage $V_{CC}$ and the rate of frequency change, R, of the oscillation output signal Vout in the oscillation circuit shown in FIG. 4. Here, for example, the resistance R3 is set to 135 kO and the capacitance C3 is set to 2212 pF. This setting permits the frequency of the oscillation signal Vout to be 8 kHz when the supply voltage $V_{CC}$ is 1.5 Volt. The graph in FIG. 5 indicates that the oscillation frequency greatly varies as the supply voltage $V_{CC}$ changes.

FIG. 6 shows a third conventional oscillation circuit. This oscillation circuit has odd-numbered stages of inverters 1h, 1i and 1j connected in series (three stages inverters in this case). The output terminal of the third inverter 1j is connected via a resistor R4 to the input terminal of the first inverter 1h, so that the inverters 1h to 1j and the resistor R4 form a closed loop circuit. The output terminal of the second inverter 1i is connected via a capacitor C4 to the input terminal of the first inverter 1h. This oscillation circuit generates an oscillation signal in accordance with the time constant of the circuit comprising the resistor R4 and the capacitor C4.

In this circuit, when the output signal of the second inverter 1i goes low, the input signal potential of the first inverter 1h falls below ground. When the output signal of the second inverter 1i goes high, the input signal potential of the first inverter 1h rises above the level of the supply voltage $V_{CC}$. In order to protect the first inverter 1h against those very high and low input potentials, a protection diode should be connected to the input terminal of the inverter 1h. If the protection diode is connected to the input terminal of the inverter 1h, however, this diode may absorbs the charges accumulated in the capacitor C4 and may influence the time constant determined by the capacitor C4 and the resistor R4. It is therefore very difficult to control the frequency of the oscillation signal based on the time constant determined by the capacitor C4 and resistor R4.

SUMMARY OF THE INVENTION

Accordingly, it is a primary objective of the present invention to provide an oscillation circuit which operates at low power consumption rates and that produces stable oscillation signals with smaller variations in oscillation frequency even under low power supply voltage conditions.

To achieve the foregoing and other objects and in accordance with the purpose of the present invention, an improved oscillation circuit is provided.

The oscillation circuit according to the present invention is supplied with power from a first power supply V1 and a second power supply V2, and comprises an input stage, intermediate stage and output stage circuits 100, 200 and 300, as shown in FIG. 7. The input stage circuit 100 is composed of a hysteresis inverter 101 having a first threshold value and a second threshold value that is set between the first threshold value and the potential of the first power supply V1. The intermediate stage circuit 200 is coupled to the input stage circuit 100 and includes an inversion circuit 201 and a delay circuit 202. The delay circuit 202 is provided between the hysteresis inverter 101 and the inversion circuit 201. The output stage circuit 300, coupled to the input stage circuit 100 and to the intermediate stage circuit 200, includes an output terminal $T_0$ connected to the hysteresis inverter 101, a capacitor 301 provided between the output terminal $T_0$ and the first power supply V1 and an inverter equivalent circuit 302 connected to the inversion circuit 201. The inverter equivalent circuit 302 controls the charging and discharging of the capacitor 301 to generate an oscillation output signal Vout at the output terminal $T_0$. When the potential of the oscillation output signal Vout shifts from the first threshold value to the potential of the first power supply V1, the delay circuit 202 causes the hysteresis inverter 101 to output a signal to the inversion circuit 201 following a predetermined time delay after the potential of the oscillation output signal Vout reaches the second threshold value. This permits the voltage swing of the oscillation output signal Vout to be set to the potential difference between the first threshold value and the potential of the first power supply V1.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

FIRST EMBODIMENT

Figure 8:
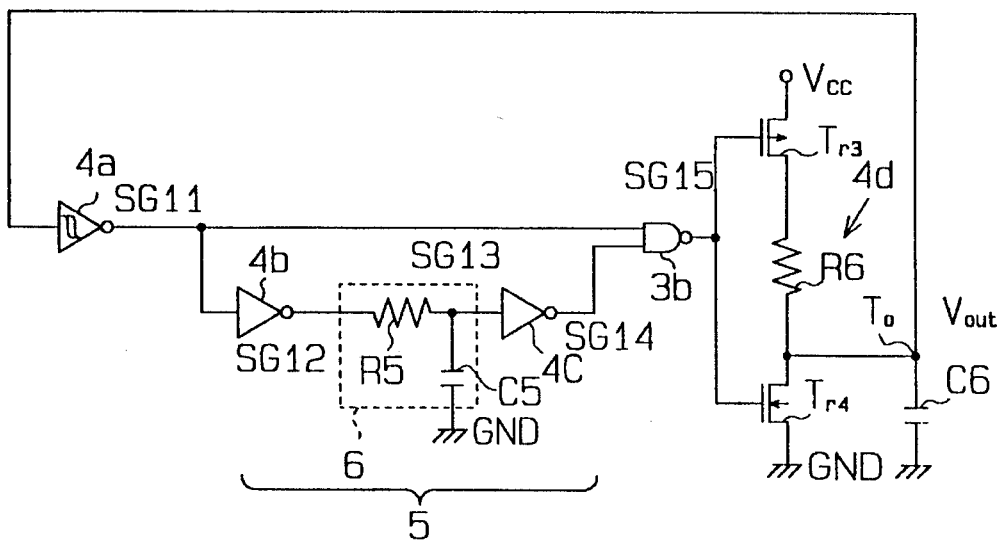
FIG. 8 is a circuit diagram showing an oscillation circuit according to a first embodiment of the present invention.

FIG. 8 shows an oscillation circuit according to a first embodiment of the present invention. This oscillation circuit includes an output terminal $T_0$ from which an oscillation output signal Vout is output, and a first inverter 4a which is a hysteresis inverter circuit. The inverter 4a receives the oscillation output signal Vout from the output terminal $T_0$. The oscillation circuit further includes a second inverter 4b, which receives the output signal, SG11, of the first inverter 4a, and a NAND gate 3b having two input terminals. The output signal SG11 is input to the first input terminal of the NAND gate 3b. The output signal, SG12, of the second inverter 4b is input as an input signal SG13 to the input terminal of the third inverter 4c via a resistor R5. The input terminal of the third inverter 4c is connected via a capacitor C5 to the ground GND. The resistor R5 and capacitor C5 form an integrator 6 which integrates the output signal SG12 of the second inverter 4b. The output signal, SG14, of the third inverter 4c is input to the second input terminal of the NAND gate 3b. The second and third inverters 4b and 4c and the integrator 6 form a delay circuit 5, which delays the rising of the output signal SG11 of the first inverter 4a.

The output signal, SG15, of the NAND gate 3b is input to the gates of a P channel MOS transistor Tr3 and an N channel MOS transistor Tr4. The transistor Tr4 has a drain connected to the output terminal $T_0$ and a source connected to the ground GND or alternatively to a first power supply. The transistor Tr3 has a source connected to a second power supply $V_{CC}$ and a drain connected to the output terminal $T_0$ via a resistor R6. The pair of transistors Tr3 and Tr4 function as an inverter circuit 4d. The output terminal $T_0$ is grounded via a capacitor C6.

Figure 9:
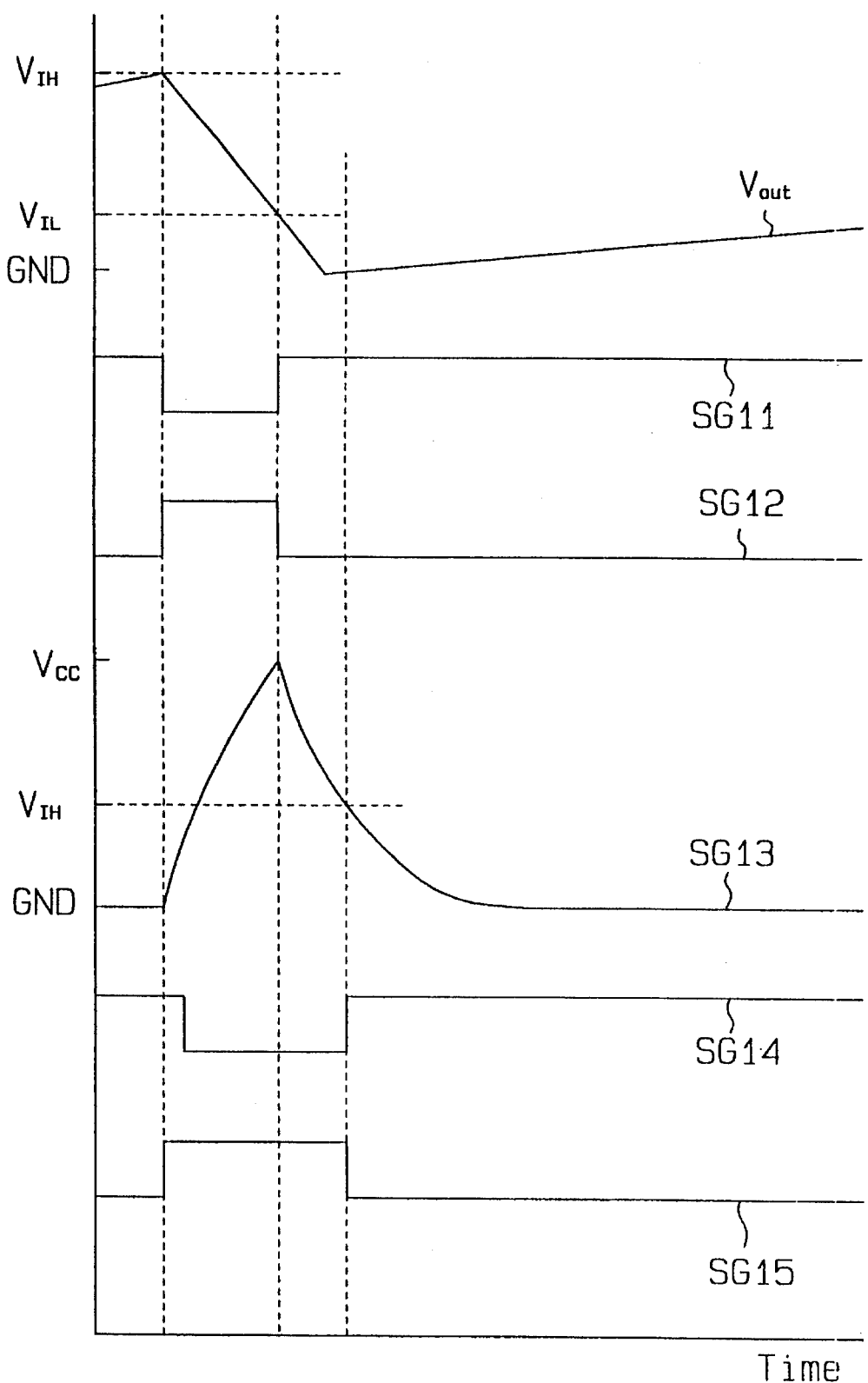
FIG. 9 is a waveform chart illustrating the operation of the oscillation circuit shown in FIG. 8.

The operation of the oscillation circuit will be described with reference to FIG. 9. This oscillation circuit continues the oscillation as long as the supply voltage $V_{CC}$ is supplied to this circuit. For example, when the level of the oscillation signal Vout has not reached the high threshold value $V_{IH}$ for the first inverter 4a, the output signal SG11 of this inverter 4a is high. At this time, the output signal SG12 of the second inverter 4b is low and the output signal SG14 of the third inverter 4c is high. This causes the output signal SG15 of the NAND gate 3b to be set low, turning on the transistor Tr3 and turning off the transistor Tr4. This, in turn, allows the charge current to be supplied via the resistor R6 to the capacitor C6 from the power supply $V_{CC}$, so that the potential of the oscillation output signal Vout rises in accordance with the time constant determined by the circuit comprising the resistor R6 and capacitor C6.

When the potential of the output signal Vout reaches the high threshold value $V_{IH}$ for the first inverter 4a, the output signal SG11 of the inverter 4a goes low. Consequently, the output signal SG15 of the NAND gate 3b goes high, turning off the transistor Tr3 and turning on the transistor Tr4. As a result, the charges accumulated in the capacitor C6 are discharged to the ground GND via the transistor Tr4. At this time, the output signal SG12 of the second inverter 4b is set high, allowing the charge current to be supplied to the capacitor C5 in accordance with the time constant of the integrator 6 comprising the resistor R5 and capacitor C5. The potential of the input signal SG13 to the third inverter 4c increases gradually. When the potential of the input signal SG13 exceeds the threshold value $V_{IH}$ for the inverter 4c, the output signal SG14 of the inverter 4c goes low.

When the potential of the oscillation output signal Vout falls below the low threshold value $V_{IL}$ for the first inverter 4a in accordance with the discharging of the capacitor C6, the output signal SG11 of the inverter 4a goes high. Then, the output signal SG12 of the second inverter 4b goes low, causing the charges accumulated in the capacitor C5 to be absorbed by the second inverter 4b via the resistor R5. The potential of the input signal SG13 of the third inverter 4c thus decreases in accordance with the time constant of the integrator 6. When the input signal SG13 falls below the threshold value $V_{IH}$ for the inverter 4c, the output signal SG14 of the inverter 4c goes high, setting the output signal SG15 of the NAND gate 3b low. As a result, the transistor Tr3 is turned on and the transistor Tr4 is turned off, allowing the charging operation of the capacitor C6 to start again. This increases the potential of the oscillation output signal Vout. The repetitions of the above-described charging and discharging operations of the capacitor C6 produce an oscillation output signal Vout which has a predetermined frequency.

According to this oscillation circuit, the instant the potential of the oscillation output signal Vout reaches the high threshold value $V_{IH}$ for the first inverter 4a, the discharging operation of the capacitor C6 starts in response to the L-level output signal SG11 of the inverter 4a. Even after the potential of the oscillation output signal Vout falls below the low threshold value $V_{IL}$, the integrator 6 allows the discharging of the capacitor C6 to continue for a predetermined period of time. When the potential of the oscillation output signal Vout falls to ground, the charging of the capacitor C6 starts again and the potential of the oscillation signal Vout starts rising. To ensure such charging and discharging operations, the time constant of the integrator 6 should be set in such a way that the discharging of the capacitor C6 is maintained during the period from when the potential of the oscillation signal Vout reaches the low threshold value $V_{IL}$ to when the potential of signal Vout falls to ground. Accordingly, the time constant of the integrator 6 in this embodiment can be set smaller than those of the above-described conventional arts. This permits the resistance of the resistor R5 and the capacitance of the capacitor C5 to be set smaller, and can thus reduce the circuit area needed for this oscillation circuit.

Even if the low threshold value $V_{IL}$ for the first inverter 4a varies due to reductions in supply voltage $V_{CC}$, the integrator 6 can absorb the variation-oriented influence to ensure that the potential of the oscillation output signal Vout drops to the ground level. This permits the oscillating output of signal Vout to have an amplitude that corresponds to the potential difference between the ground level and the high threshold value $V_{IH}$ for the first inverter 4a regardless of variations in supply voltage $V_{CC}$. This amplitude is notably larger than those of any conventional arts discussed earlier. With the sufficiently large amplitude of the oscillation output signal Vout, the duty ratio, which is the ratio of the time of the output signal falling to the time of the output signal rising, can be set large. Even if the threshold values $V_{IH}$ and $V_{IL}$ for the hysteresis inverter 4a vary due to variations in quality control during the circuit manufacturing process, variations in the voltage swing of the oscillation output signal Vout can be minimized.

According to this embodiment, since the oscillation output signal Vout has a sufficiently large amplitude, a change in the amplitude of the output signal Vout due to variations in high threshold value $V_{IH}$ is small. Because of the large duty ratio, the frequency of the oscillation output signal Vout is less affected by changes in low threshold value $V_{IL}$. Even if the operational speed of the inverter 4a becomes slower, this will not significantly influence the frequency of the oscillation output signal Vout. Accordingly, the size of each transistor used to form the first inverter 4a can be reduced, and the flowthrough current of the inverter 4a can be suppressed to reduce the consumed power of the inverter 4a.

The first inverter 4a, the NAND gate 3b and the inverter circuit 4d having the output transistors Tr3 and Tr4, form a closed loop of three stages of inverter circuits. This closed loop circuit can maintain oscillating operation as long as the supply voltage $V_{CC}$ is supplied to the oscillation circuit.

Figure 5:
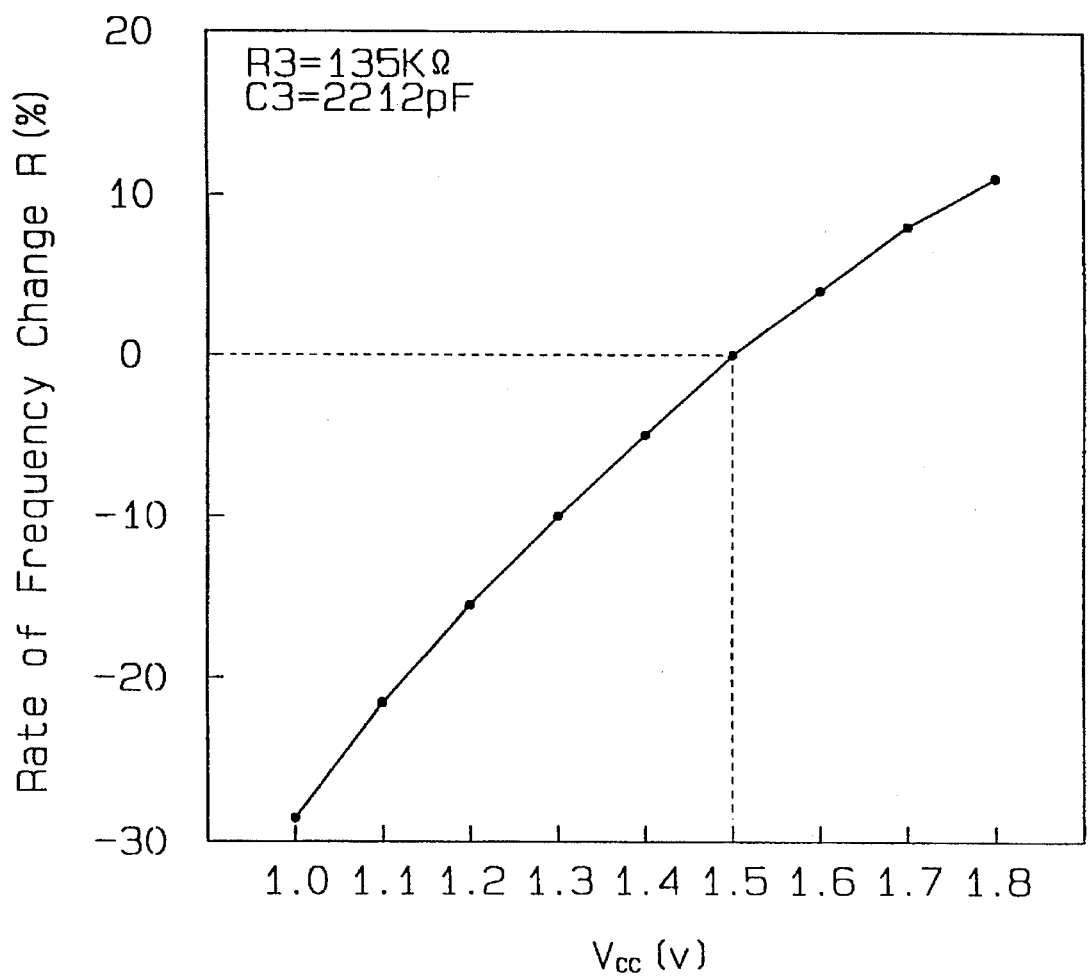
FIG. 5 is a graph illustrating the relationship between the supply voltage and the rate of frequency change in the oscillation circuit shown in FIG. 4.
Figure 6:
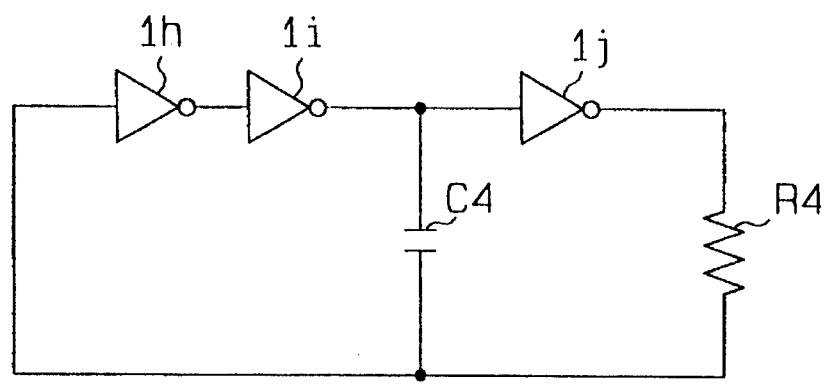
FIG. 6 is a circuit diagram showing a third conventional oscillation circuit.
Figure 7:
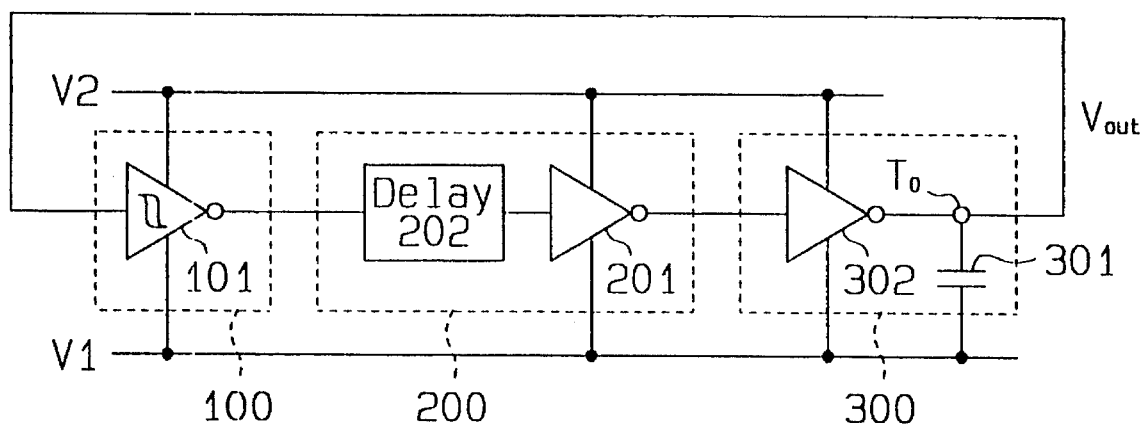
FIG. 7 is a diagram for explaining the summary of the present invention.
Figure 10:
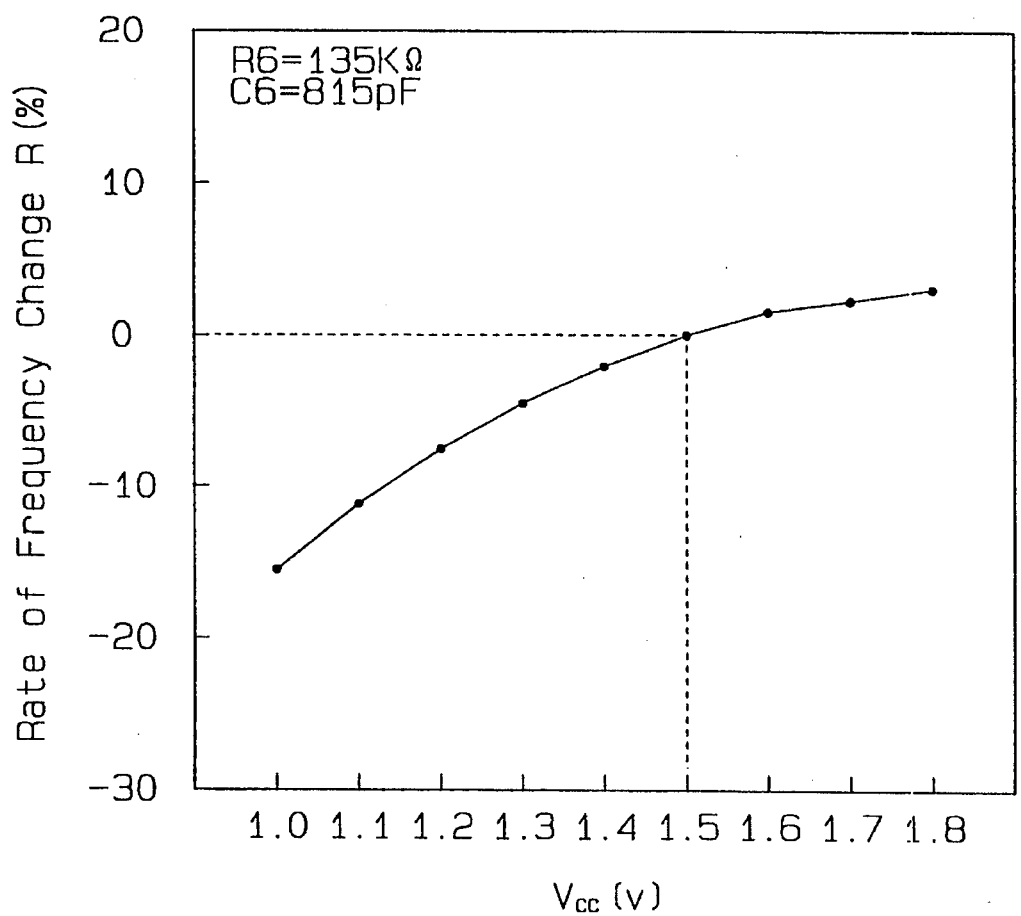
FIG. 10 is a graph illustrating the relationship between the supply voltage and the rate of frequency change in the oscillation circuit shown in FIG. 8.

FIG. 10 illustrates the relationship between the supply voltage $V_{CC}$ and the rate, R, of frequency change of the output signal Vout in the oscillation circuit shown in FIG. 8. In this example, the resistance R6 is set to 135 kO and the capacitance C6 is set to 815 pF. This setting permits the frequency of the oscillation output signal Vout to be 8 kHz when the supply voltage $V_{CC}$ is 1.5 V. The slope of the graph in FIG. 10 is less steep than that of the graph in FIG. 5. In other words, variations in oscillation output signal Vout due to changes in supply voltage $V_{CC}$ are smaller than those of the aforementioned second type of conventional art.

Figure 11:
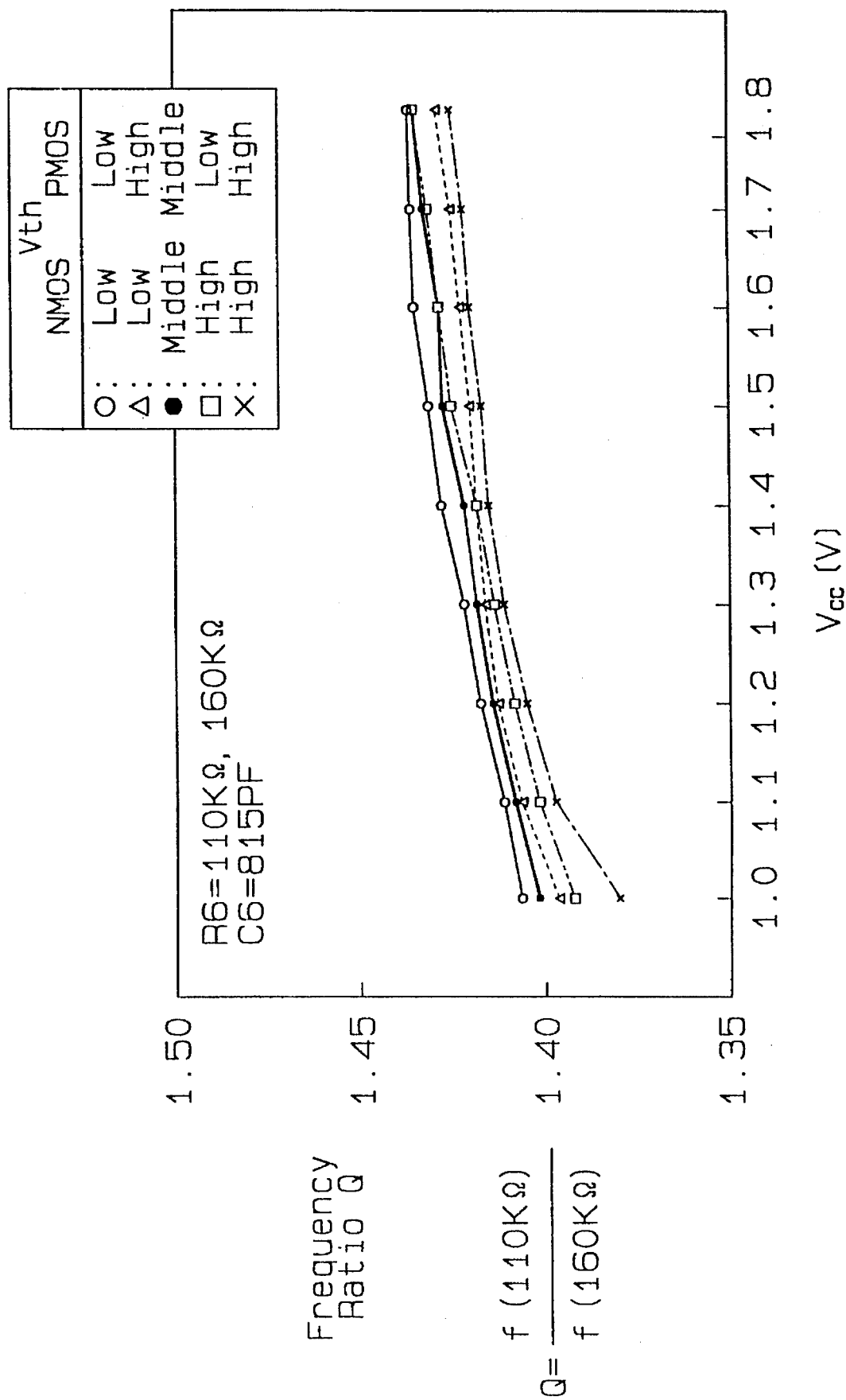
FIG. 11 is a graph illustrating the relationship between the supply voltage and the frequency ratio in the oscillation circuit shown in FIG. 8.

FIG. 11 illustrates the relationship between the supply voltage $V_{CC}$ and the frequency ratio Q in the oscillation circuit shown in FIG. 8. This represents conditions when the resistance R6 is set to 110 kO (=135−25) and 160 kO (=135+25) and the capacitance C6 is set to 815 pF. The frequency ratio Q is defined by the following equation.

$$Q=f(110\ kO)/f(160\ kO)$$

where f(110 kO) is the frequency of the output signal Vout when the supply voltage $V_{CC}$=1.5 V is supplied to the oscillation circuit with the resistor R6 having a resistance of 110 kO, and f(160 kO) is the frequency of the output signal Vout when the supply voltage $V_{CC}$=1.5 V is supplied to the oscillation circuit with the resistor R6 having a resistance of 160 kO.

Two time constants can be set by the combinations of one capacitance and two resistances. In addition, the hysteresis inverter 4a comprises a P channel MOS transistor and an N channel MOS transistor each having a threshold value $V_{th}$. Those threshold values $V_{th}$ can take a relative high value, an intermediate value (i.e., the designed value) and a relatively low value, depending on variations in manufacturing conditions. As shown in FIG. 11, the frequency ratio Q was measured under five conditions according to the combinations of the threshold values $V_{th}$ of the PMOS and NMOS transistors of the inverter 4a. The capacitance (815 pF) of the capacitor C6 is the value which permits the frequency of the oscillation output signal Vout to be 8 kHz when the supply voltage $V_{CC}$ is 1.5 V in the oscillation circuit using an inverter 4a including the PMOS and NMOS transistors having the intermediate threshold value, respectively. As apparent from the graph in FIG. 11, the frequency ratio is influenced at individual voltage values by variations in manufacturing conditions. Further, the frequency ratio tends to decrease as the supply voltage $V_{CC}$ drops.

SECOND EMBODIMENT

A second embodiment of the present invention will now be described with reference to FIG. 12. The second embodiment is substantially the same as the first embodiment, except that a P channel MOS transistor Tr5, which is normally turned on serving as a resistor with high resistance, is additionally provided between the output terminal of the inverter 4a of the first embodiment and the power supply $V_{CC}$. With this constitution the high threshold value $V_{IH}$ for the first inverter 4a is substantially pulled up and the turn-on resistance of the N channel MOS transistor (not shown) forming the inverter 4a is lowered. Consequently, when the oscillation output signal Vout reaches the high threshold value $V_{IH}$, the NMOS transistor in the inverter 4a is turned on instantaneously. This improves the operational speed of the inverter 4a and decreases the flowthrough current of the inverter 4a to reduce the consumed power.

Figure 1:
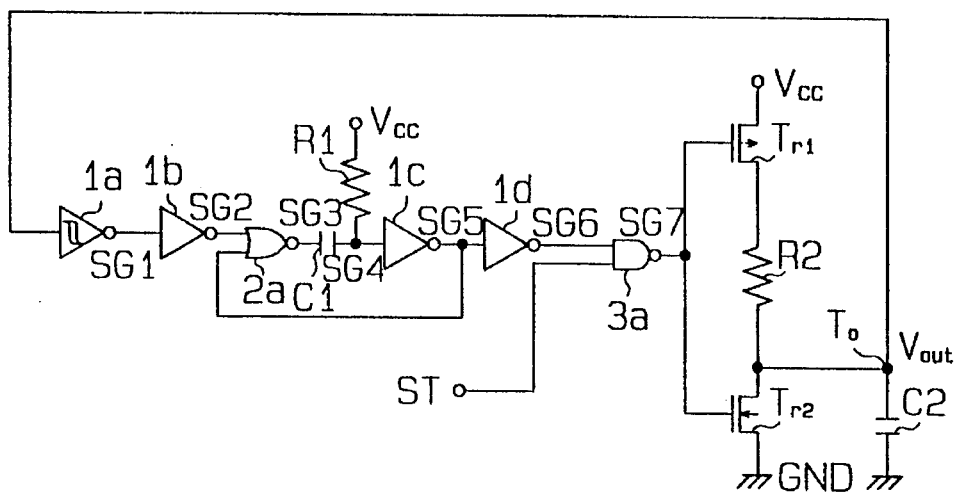
FIG. 1 is a circuit diagram showing a first conventional oscillation circuit.
Figure 3:
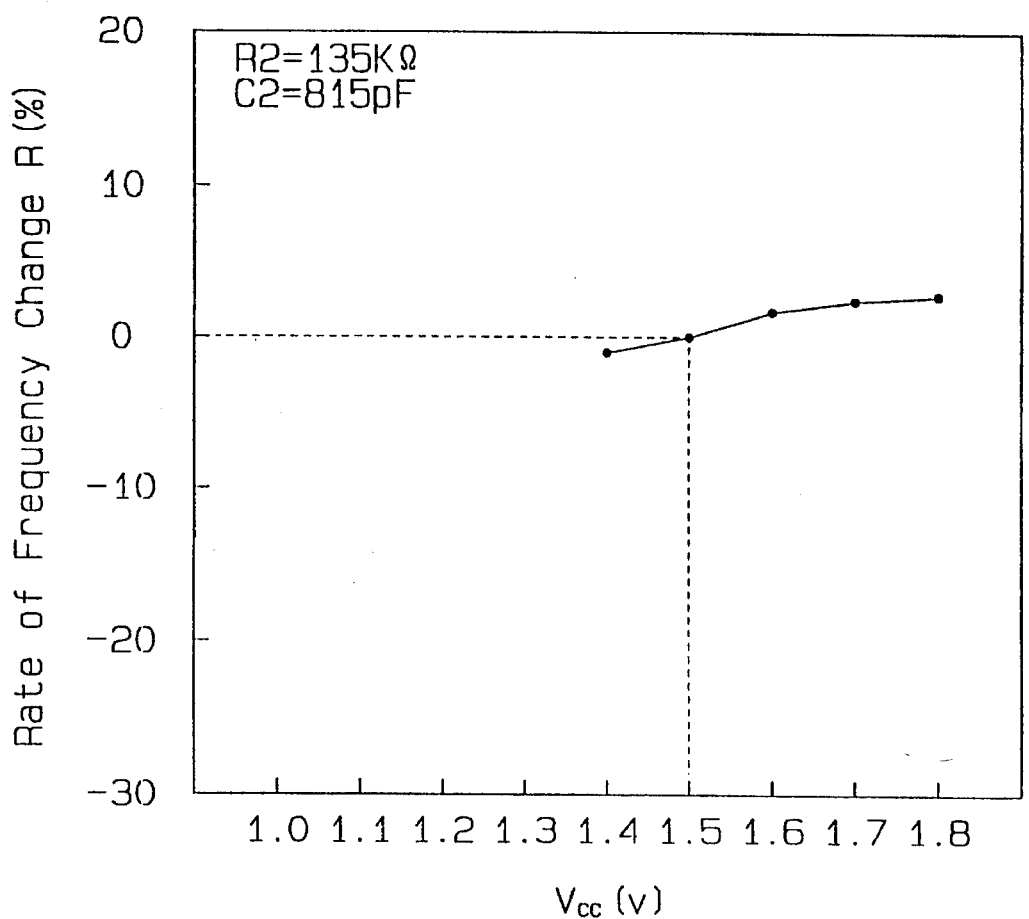
FIG. 3 is a graph illustrating the relationship between the supply voltage and the rate of change in the frequency of the oscillation circuit shown in FIG. 1.
Figure 2:
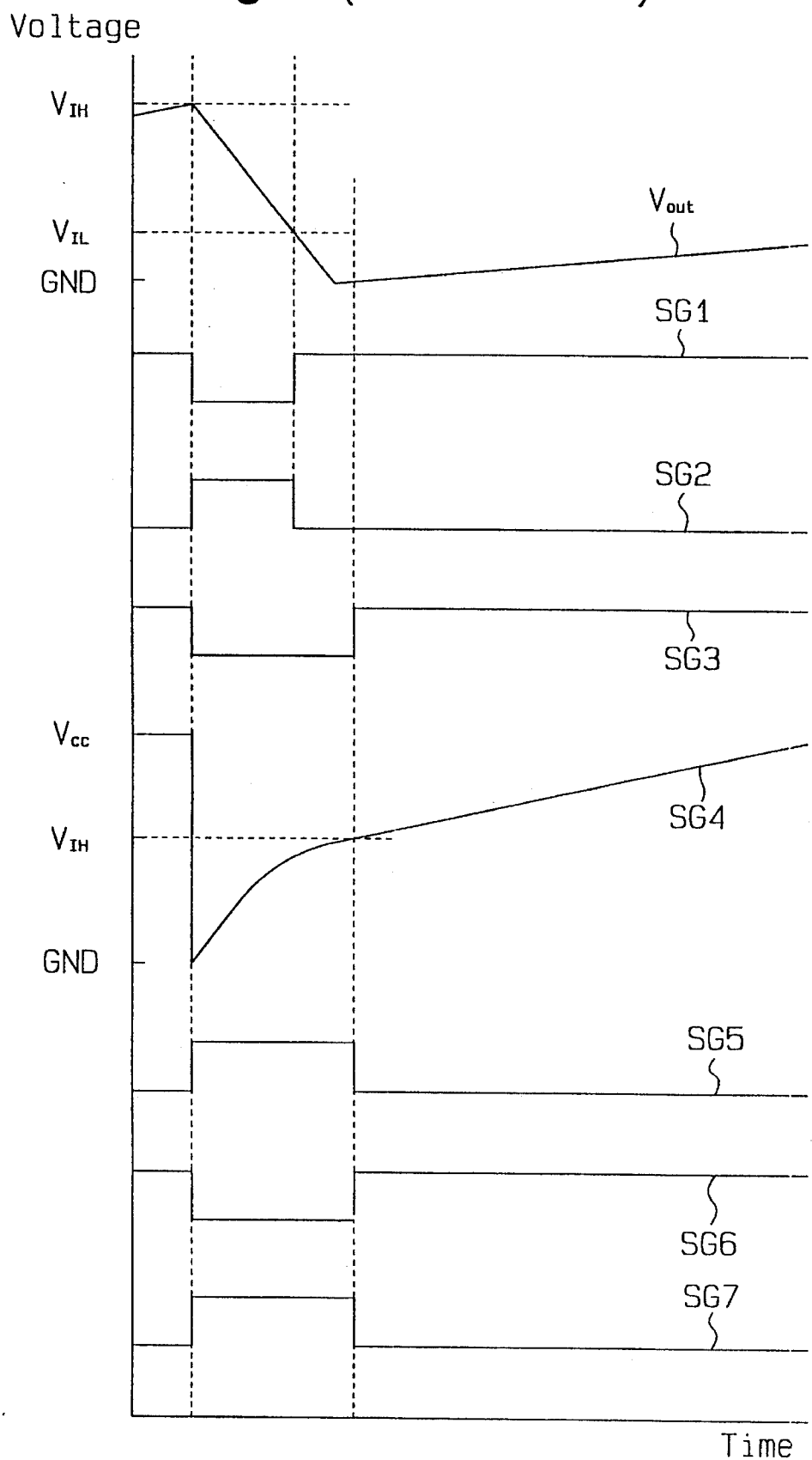
FIG. 2 is a waveform chart illustrating the operation of the oscillation circuit shown in FIG. 1.
Figure 4:
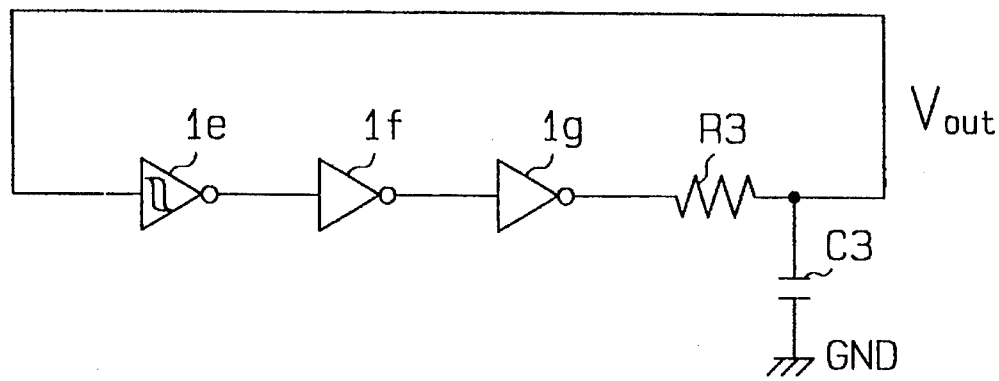
FIG. 4 is a circuit diagram showing a second conventional oscillation circuit.
Figure 12:
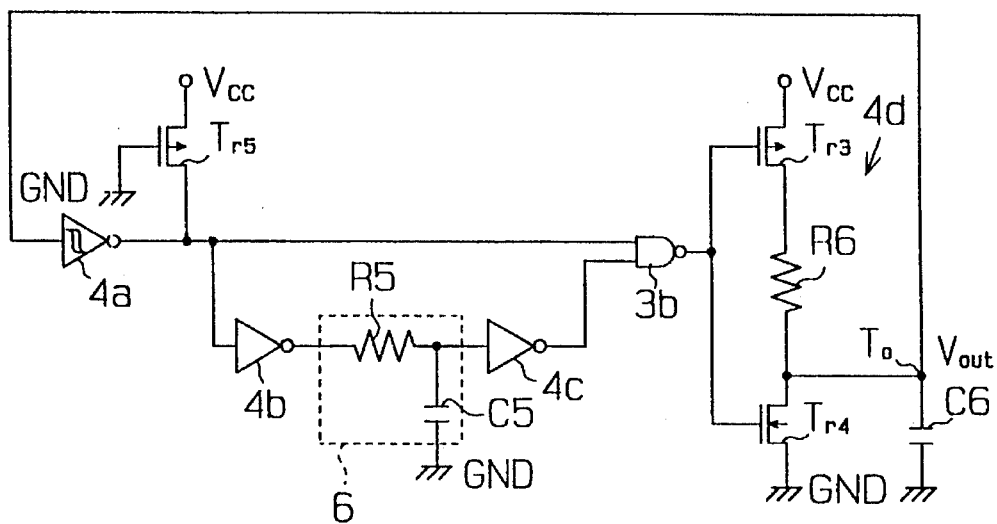
FIG. 12 is a circuit diagram showing an oscillation circuit according to a second embodiment of the present invention.
Figure 13:
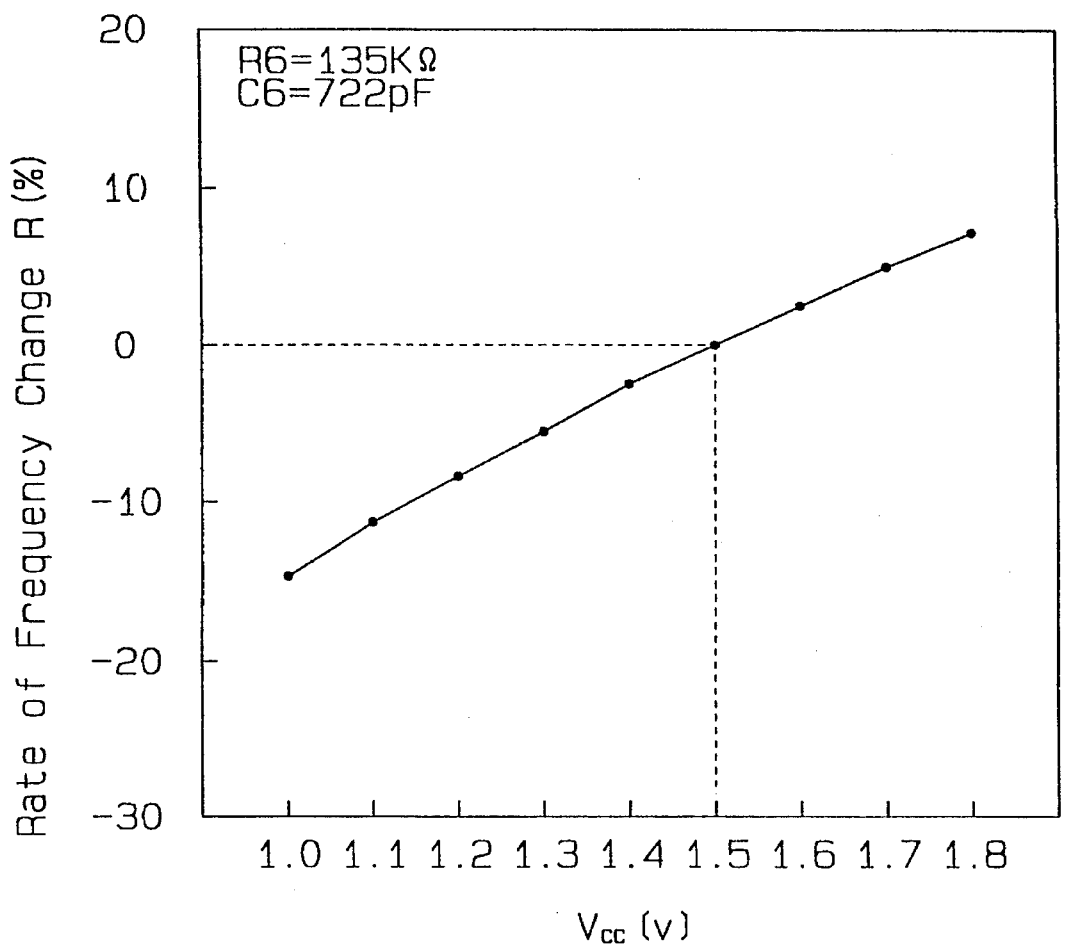
FIG. 13 is a graph illustrating the relationship between the supply voltage and the rate of frequency change in the oscillation circuit shown in FIG. 12.

FIG. 13 illustrates the relationship between the supply voltage $V_{CC}$ and the rate, R, of the change in frequency of the output signal Vout in the oscillation circuit shown in FIG. 12. In acquiring this relation, the resistance R6 is set to 135 kO and the capacitance C6 is set to 722 pF, the setting of which permits the frequency of the oscillation output signal Vout to be 8 kHz when the supply voltage $V_{CC}$ is 1.5 V. The slope of the graph in FIG. 13 is less steep than that of the graph for the second type of conventional art shown in FIG. 5. In other words, variations in oscillation output signal Vout due to changes in supply voltage $V_{CC}$ are smaller than that of the second conventional art. Further, the graph in FIG. 13 exhibits greater linearity than the graph for the first type of conventional art shown in FIG. 3.

Figure 14:
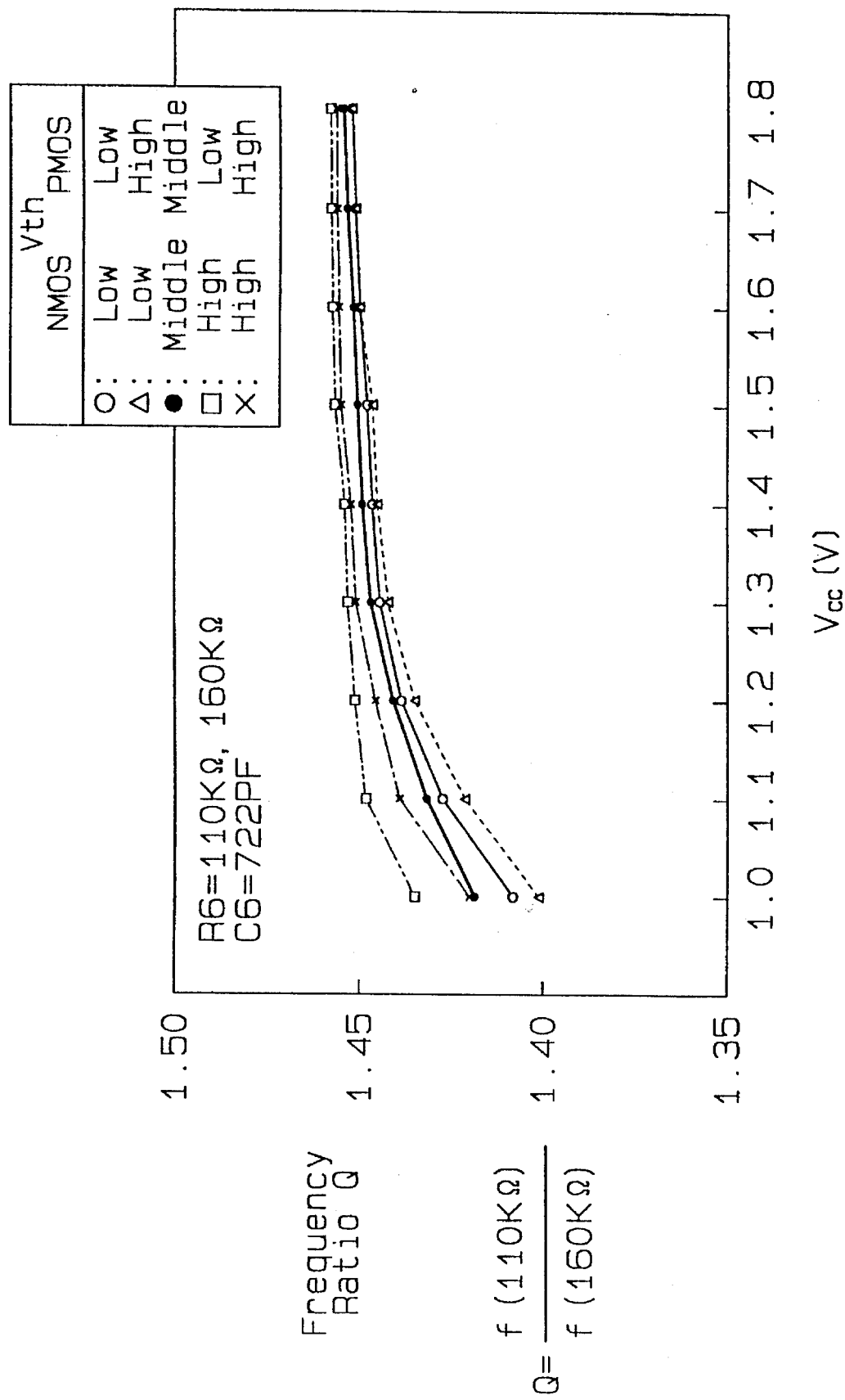
FIG. 14 is a graph illustrating the relationship between the supply voltage and the frequency ratio in the oscillation circuit shown in FIG. 12.

FIG. 14 illustrates the relationship between the supply voltage $V_{CC}$ and the frequency ratio Q in the oscillation circuit in FIG. 12. This relationship is obtained in the same manner as done in the first embodiment; the resistance R6 is set to 110 kO (=135−25) and 160 kO (=135+25) and the capacitance C6 is set to 722 pF. It is apparent from FIG. 14 that when the supply voltage $V_{CC}$ lies within a range from 1.3 V to 1.8 V, the frequency ratio Q is relatively constant as compared with that of the first embodiment, regardless of variations in quality in the manufacturing process and changes in supply voltage $V_{CC}$.

THIRD EMBODIMENT

Figure 15:
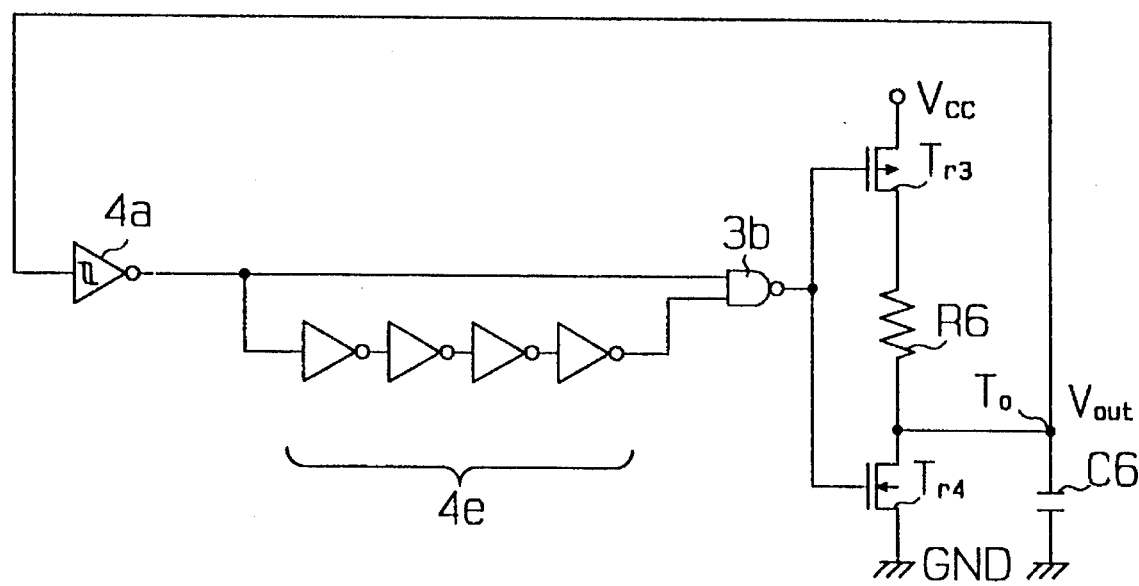
FIG. 15 is a circuit diagram showing an oscillation circuit according to a third embodiment of the present invention.

A third embodiment of the present invention will now be described with reference to FIG. 15. The oscillation circuit according to the third embodiment is equivalent to that of the first embodiment shown in FIG. 8 whose inverters 4b and 4c and integrator 6 are replaced with even-numbered stages of inverters 4e (four stages in this embodiment). According to this constitution, when the output signal of the hysteresis inverter 4a goes high, the falling of the output signal of the NAND gate 3b is delayed by the operational time of the inverters 4e. The function of this oscillation circuit is the same as that of the first embodiment.

FOURTH EMBODIMENT

Figure 16:
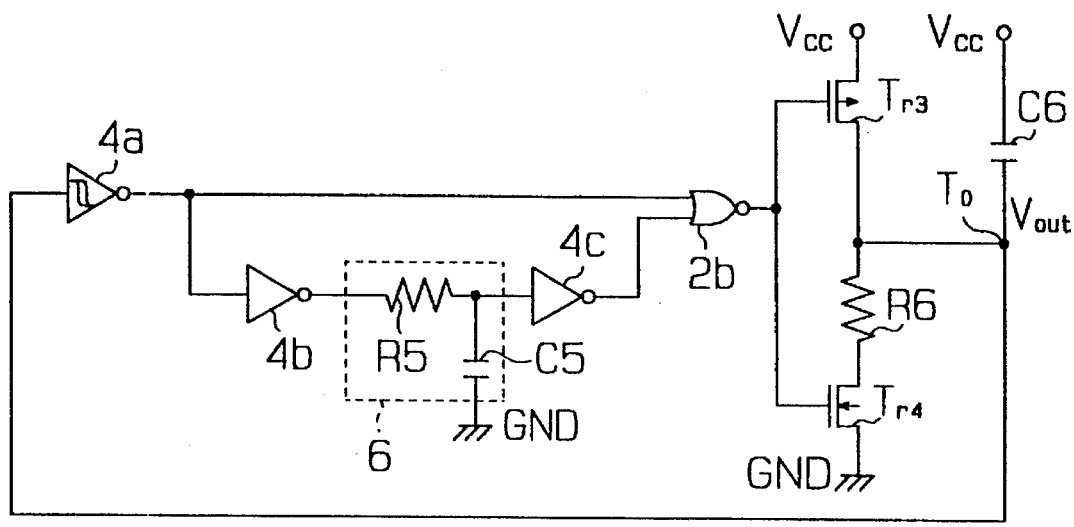
FIG. 16 is a circuit diagram showing an oscillation circuit according to a fourth embodiment of the present invention.

FIG. 16 illustrates a fourth embodiment of the present invention. The oscillation circuit of this embodiment differs from that of the first embodiment in that the NAND gate 3b of the first embodiment is replaced with a NOR gate 2b and in that the capacitor C6 is provided between the first high-potential power supply $V_{CC}$ and the output terminal $T_0$ (i.e., a node between the PMOS transistor Tr3 and resistor R6). A second power supply may be provided with a voltage less than that of $V_{cc}$, or alternatively, with a voltage potential at ground. The output signal Vout in the first embodiment oscillates between the ground level and the potential level of the high threshold value $V_{IH}$ for the inverter 4a, while the potential of the oscillation output signal Vout in this fourth embodiment changes between the supply voltage $V_{CC}$ and the potential level of the low threshold value $V_{IL}$ for the hysteresis inverter 4a.

FIFTH EMBODIMENT

Figure 17:
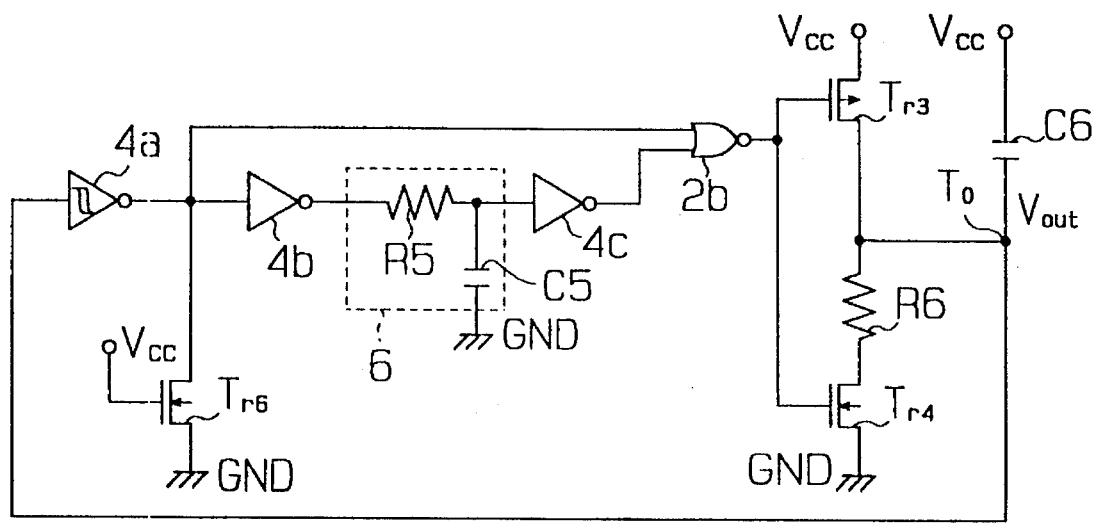
FIG. 17 is a circuit diagram showing an oscillation circuit according to a fifth embodiment of the present invention.

FIG. 17 illustrates a fifth embodiment of the present invention. The oscillation circuit of the fifth embodiment differs from that of the fourth embodiment in that an N channel MOS transistor Tr6, which is normally turned on serving as a resistor with a high resistance, is provided additionally between the ground GND and the output terminal of the hysteresis inverter 4a of the fourth embodiment. A first power source serves as the voltage source $V_{CC}$ while a second power source serves as a voltage source having a potential less than $V_{CC}$. Alternatively, the second power source may serve as ground.

With this design, the low threshold value $V_{IL}$ for the inverter circuit 4a is substantially pulled down, and the turn-on resistance of the P channel MOS transistor (not shown) in the inverter 4a is reduced. When the level of the oscillation output signal Vout reaches the low threshold value $V_{IL}$, the PMOS transistor in the inverter 4a is turned on instantaneously. This improves the operational speed of the inverter 4a and decreases the flowthrough current of the inverter 4a to reduce the consumed power.

Although only five embodiments of the present invention have been described herein, it should be apparent to those skilled in the art that the present invention may be embodied in many other specific forms without departing from the spirit or scope of the invention.

Therefore, the present examples and embodiments are to be considered as illustrative and not restrictive and the invention is not to be limited to the details given herein, but may be modified within the scope of the appended claims.

What is claimed is:

1. An oscillation circuit, supplied with power from a first power supply and a second power supply, comprising:

an input stage circuit composed of a hysteresis inverter having a first threshold value and a second threshold value set between said first threshold value and the potential of said first power supply;

an intermediate stage circuit coupled to said input stage circuit and including an inversion circuit and a delay circuit, said delay circuit being provided between said hysteresis inverter and said inversion circuit; and an output stage circuit coupled to said input stage circuit and said intermediate stage circuit, said output stage circuit including an output terminal connected to said hysteresis inverter, a capacitor provided between said output terminal and said first power supply, and an inverter circuit, connected to said inversion circuit, for controlling the charging and discharging of said capacitor to generate an oscillation output signal at said output terminal, wherein when the potential of said oscillation output signal shifts from said first threshold value to the potential of said first power supply, said delay circuit causes said hysteresis inverter to output a signal to said inversion circuit of said intermediate stage circuit following a time delay after said oscillation output signal reaches said second threshold value, thereby setting the voltage swing of said oscillation output signal to the potential difference between said first threshold value and the potential of said first power supply, and wherein said first power supply is a low-potential power supply, said second power supply is a high-potential power supply, said first threshold value is a high threshold value for said hysteresis inverter, and said second threshold value is a low threshold value for said hysteresis inverter.

2. The oscillation circuit according to claim 1, wherein said delay circuit includes:

a first inverter for receiving output signals of said hysteresis inverter;

a second inverter connected to said inversion circuit; and an integrator provided between said first inverter and said second inverter.

3. The oscillation circuit according to claim 2, wherein said inversion circuit of said intermediate stage circuit includes a NAND gate having a first input terminal for receiving the output signal of said hysteresis inverter and a second input terminal for receiving output signals of said second inverter in said delay circuit.

4. The oscillation circuit according to claim 1 further comprising a P channel MOS transistor connected between an output terminal of said hysteresis inverter and the high-potential power supply as said second power supply, said P channel MOS transistor operating as a resistor when turned on.

5. The oscillation circuit according to claim 1, wherein said delay circuit is formed by even-numbered stages of inverters connected in series, in which a first stage inverter receives an output signal of said hysteresis inverter and a last stage inverter is connected to said inversion circuit.

6. The oscillation circuit according to claim 5, wherein said inversion circuit of said intermediate stage circuit includes a NAND gate having a first input terminal for receiving the output signal of said hysteresis inverter and a second input terminal for receiving the output signal of said last stage inverter in said delay circuit.

7. The oscillation circuit according to claim 1, wherein said inverter circuit in said output stage circuit includes a P channel MOS transistor and an N channel MOS transistor; and wherein said output stage circuit further includes a resistor provided between said P channel MOS transistor and said N channel MOS transistor, said resistor being connected to said capacitor.

8. An oscillation circuit, supplied with power from a first power supply and a second power supply, comprising:

an input stage circuit composed of a hysteresis inverter having a first threshold value and a second threshold value set between said first threshold value and the potential of said first power supply;

an intermediate stage circuit coupled to said input stage circuit and including an inversion circuit and a delay circuit, said delay circuit being provided between said hysteresis inverter and said inversion circuit; and an output stage circuit coupled to said input stage circuit and said intermediate stage circuit, said output stage circuit including an output terminal connected to said hysteresis inverter, a capacitor provided between said output terminal and said first power supply, and an inverter circuit, connected to said inversion circuit, for controlling the charging and discharging of said capacitor to generate an oscillation output signal at said output terminal, wherein when the potential of said oscillation output signal shifts from said first threshold value to the potential of said first power supply, said delay circuit causes said hysteresis inverter to output a signal to said inversion circuit of said intermediate stage circuit following a time delay after said oscillation output signal reaches said second threshold value, thereby setting the voltage swing of said oscillation output signal to the potential difference between said first threshold value and the potential of said first power supply, and wherein said first power supply is a high-potential power supply, said second power supply is a low-potential power supply, said first threshold value is a low threshold value for said hysteresis inverter, and said second threshold value is a high threshold value for said hysteresis inverter.

9. The oscillation circuit according to claim 8, wherein said delay circuit includes:

a first inverter for receiving output signals of said hysteresis inverter;

a second inverter connected to said inversion circuit; and an integrator provided between said first inverter and said second inverter.

10. The oscillation circuit according to claim 9, wherein said inversion circuit of said intermediate stage circuit includes a NOR gate having a first input terminal for receiving the output signal of said hysteresis inverter and a second input terminal for receiving an output signal of said second inverter in said delay circuit.

11. The oscillation circuit according to claim 8 further comprising an N channel MOS transistor connected between an output terminal of said hysteresis inverter and the low-potential power supply as said second power supply, said N channel MOS transistor operating as a resistor when turned on.

12. The oscillation circuit according to claim 8, wherein said inverter circuit in said output stage circuit includes a P channel MOS transistor and an N channel MOS transistor; and wherein said output stage circuit further includes a resistor provided between said P channel MOS transistor and said N channel MOS transistor, said resistor being connected to said capacitor.

* * * * *